(12) United States Patent
Koishi (10) Patent No.: US 6,948,110 B2
(45) Date of Patent: Sep. 20, 2005

(54) TRANSMISSION DATA LOSS DETECTION SYSTEM (75) Inventor: Takahiro Koishi, Tokyo (JP)

(73) Assignee: NEC Corporation, Tokyo (JP)

( * ) Notice: Subject to any disclaimer, the term of this patent is extended or adjusted under 35 U.S.C. 154(b) by 538 days.

(21) Appl. No.: 10/084,970

(22) Filed: Mar. 1, 2002

(65) Prior Publication Data

US 2002/0124220 A1 Sep. 5, 2002

(30) Foreign Application Priority Data

Mar. 2, 2001 (JP) ........................................ 2001-057518

(51) Int. Cl.⁷ ............................................. H03M 13/00
(52) U.S. Cl. ........................ 714/752; 714/52; 714/821
(58) Field of Search ................................ 714/752, 784, 714/782, 746, 758, 799, 800, 807, 821, 2, 4, 16, 18, 52, 712, 43; 370/452; 340/825.5; 455/426

(56) References Cited

U.S. PATENT DOCUMENTS 4,654,654 A * 3/1987 Butler et al. ............. 340/825.5
5,757,826 A * 5/1998 Fredrickson ................ 714/784
6,005,869 A * 12/1999 Sakai et al. ................. 370/452
6,275,966 B1 * 8/2001 Sitterley ..................... 714/782
2002/0128009 A1 * 9/2002 Boch et al. ................. 455/426

FOREIGN PATENT DOCUMENTS

JP          63-246049 A     10/1988

* cited by examiner

Primary Examiner—Albert Decady
Assistant Examiner—Dipakkumar Gandhi
(74) Attorney, Agent, or Firm—Sughrue Mion, PLLC (57) ABSTRACT In a sending unit, a deblocking circuit deblocks parent data into each piece of unit data, an ID-generating circuit generates an ID, and an ECC-generating circuit generates an ECC for a data sequence having unit data and an ID. A sending/receiving circuit sends the data sequence having the unit data and the ECC to a transmission path as send data. In the receiving unit, a sending/receiving circuit receives the send data as receive data. An ID-generating circuit generates an expected ID for the unit data in the receive data. An ECC calculating circuit calculates an expected ECC for the data sequence having the unit data and the expected ID. A compare circuit compares the ECC and the expected ECC. When both values are not identical, a resend-request circuit issues a resend request including the expected ID to the sending unit. When the ECC and the expected ECC are identical, a blocking circuit blocks each piece of unit data.

14 Claims, 7 Drawing Sheets

TRANSMISSION DATA LOSS DETECTION SYSTEM

BACKGROUND OF THE INVENTION

The present invention relates to a transmission data loss detection system, and more particularly, to a transmission data loss detection system in a data transmission system having a sending unit which performs data deblocking and a receiving unit which performs data blocking.

When the sending unit performs deblocking of a chunk of data (hereinafter referred to as parent data) into some pieces of data (hereinafter referred to as unit data) and sends each piece of unit data to the receiving unit, there is a possibility that a part of the unit data might be lost along the transmission path. The above problem can be prevented by assigning an ID (Identification) to each piece of unit data, and the receiving unit controls the IDs of the received unit data and issues the resend request to the sending unit in case of an ID loss.

For example, in the "Transmission Communication Method" disclosed in Japanese Unexamined Patent Application Publication No.63-246049, a block, that is, a data transmission unit is subdivided into arbitrary units of data, and an identification character (corresponding to an ID) and a check character (corresponding to an ECC (error control code) in the present invention) are added to each unit of data to be sent.

However, in the conventional technology described above, the sending unit needs to send an ID of the unit data together with the unit data and the check character rather than to send only the unit data and the check character. Accordingly, when compared with sending only the unit data and the check character, the bandwidth-usage efficiency becomes lowered.

SUMMARY OF THE INVENTION

Accordingly, it is an object of the present invention to provide a transmission data loss detection method which can detect a bit error or loss of the unit data and request resending while maintaining the usage efficiency of the bandwidth of the case where only the unit data and the error control code (ECC) are sent. The method is achieved by providing a mechanism which can detect a bit error or loss of the unit data without adding redundant data such as indicating an ID of the unit data.

It is another object of the present invention to provide a transmission data loss detection system which realizes the transmission data loss detection method described above.

In this regard, in the following description, a term "error control code (ECC)" is used in a wide sense which includes an error detecting code (EDC) and error correcting code (ECC).

According to a first aspect of the present invention, there is provided a transmission data loss detection method in a data transmission system in which a sending unit deblocks parent data into pieces of unit data and sends each piece of unit data in sequence, and a receiving unit blocks each piece of received unit data to reconstruct the parent data, including: a calculating step of an ECC for a data sequence having an ID added corresponding to each piece of unit data in the sending unit; a sending step of send data having each piece of unit data with the added ECC; a step for returning each ID to the corresponding expected ID and resending from the unit data corresponding to the expected ID in case of receiving a resend request including an expected ID from the receiving unit; a step for receiving the send data as receive data and calculating the expected ECC for the data sequence having an expected ID added corresponding to each piece of unit data in the receive data in the receiving unit; a comparing step of the ECC in the receive data and the expected ECC; an issuing step of resend request including the expected ID to the sending unit in the case where the ECC in the receive data and the expected ECC are not the same; and a blocking step of the corresponding unit data in the case where the ECC in the receive data and the expected ECC are the sane.

Also, in a transmission data loss detection method according to the first aspect of the present invention, the ID may be incremented cyclically in a predetermined range.

According to a second aspect of the present invention, there is provided a transmission data loss detection system, including: a sending unit for deblocking parent data into each piece of unit data and sending each piece of unit data in sequence; and a receiving unit for blocking each piece of received unit data to reconstruct the parent data, wherein the sending unit includes a deblocking circuit for deblocking parent data into each piece of unit data, a deblocking buffer for storing each piece of unit data deblocked by the deblocking circuit, an ID-generating circuit for generating an ID corresponding to each piece of unit data, an ECC-generating circuit for generating an ECC for the data sequence having the unit data and the ID, a send-data buffer for storing the data sequence having the unit data and the ECC, and a sending/receiving circuit for sending the data sequence stored in the send-data buffer to a transmission path as send data; and the receiving unit includes a sending/receiving circuit for receiving the send data from the transmission path as receive data, a receive-data buffer for storing the receive data received by the sending/receiving circuit, an ID-generating circuit for generating an expected ID corresponding to each piece of unit data in the receive data, an ECC-calculating circuit for calculating an expected ECC for the data sequence having the unit data and the expected ID in the receive data, a compare circuit for comparing the ECC and the expected ECC in the receive data, a blocking buffer for storing the corresponding unit data in the case where the ECC and the expected ECC in the receive data are the same, a resend-request circuit for issuing a resend request including the expected ID to the sending unit in the case where the ECC and the expected ECC in the receive data are not the same, and a blocking circuit for blocking all the unit data to reconstruct the parent data when all the unit data constituting the parent data is stored in the blocking buffer.

According to a third aspect of the present invention, there is provided a sending unit including: a deblocking circuit for deblocking parent data into each piece of unit data; a deblocking buffer for storing each piece of unit data deblocked by the deblocking circuit; an ID-generating circuit for generating an ID corresponding to each piece of unit data; an ECC-generating circuit for generating an ECC for the data sequence having the unit data and the corresponding ID; a send-data buffer for storing the data sequence having the unit data and the ECC; and a sending/receiving circuit for sending the data sequence stored in the send-data buffer to a transmission path as send data.

According to a fourth aspect of the present invention, there is provided a receiving unit including: a sending/receiving circuit for receiving send data from a transmission path as receive data; a receive-data buffer for storing the receive data received by the sending/receiving circuit; an ID-generating circuit for generating an expected ID corresponding to each piece of unit data in the receive data; an ECC-calculating circuit for calculating an expected ECC for the data sequence having each piece of unit data and the expected ID in the receive data; a compare circuit for comparing the ECC and the expected ECC in the receive data; a blocking buffer for storing the corresponding unit data in the case where the ECC and the expected ECC: in the receive data are the same; a resend-request circuit for issuing a resend request including the expected ID to the sending unit in the case where the ECC and the expected ECC in the receive data are not the same; and a blocking circuit for blocking all the unit data to reconstruct the parent data when all the unit data constituting the parent data is stored in the blocking buffer.

According to a fifth aspect of the present invention, there is provided a transmission data loss detection system, including: a sending unit for deblocking parent data into each piece of unit data and sending each piece of unit data in sequence; and a receiving unit for blocking each piece of received unit data to reconstruct the parent data, wherein the sending unit includes a deblocking means for deblocking parent data into each piece of unit data, a deblocking buffer means for storing each piece of unit data deblocked by the deblocking means, an ID-generating means for generating an ID corresponding to each piece of unit data, an ECC-generating means for generating an ECC for the data sequence having the unit data and the ID, a send-data buffer means for storing the data sequence having the unit data and the ECC, and a sending/receiving means for sending the data sequence stored in the send-data buffer to a transmission path as send data, and the receiving unit includes a sending/receiving means for receiving the send data from the transmission path as receive data, a receive-data buffer means for storing the receive data received by the sending/receiving means, an ID-generating means for generating an expected ID corresponding to each piece of unit data in the receive data, an ECC-calculating means for calculating an expected ECC for the data sequence having the unit data and the expected ID in the receive data, a compare means for comparing the ECC and the expected ECC in the receive data, a blocking buffer means for storing the corresponding unit data in the case where the ECC and the expected ECC in the receive data are the same, a resend-request means for issuing a resend request including the expected ID to the sending unit in the case where the ECC and the expected ECC in the receive data are not the same, and a blocking means for blocking all the unit data to reconstruct the parent data when all the unit data constituting the parent data is stored in the blocking buffer.

According to a sixth aspect of the present invention, there is provided a sending unit including: deblocking means for deblocking parent data into each piece of unit data; deblocking buffer means for storing each piece of unit data deblocked by the deblocking means; ID-generating means for generating an ID corresponding to each piece of unit data; ECC-generating means for generating an ECC for the data sequence having the unit data and ID; send-data buffer means for storing the data sequence having the unit data and the ECC; and sending/receiving means for sending the data sequence stored in the send-data buffer to a transmission path as send data.

According to a seventh aspect of the present invention, there is provided a receiving unit including: sending/receiving means for receiving the send data from a transmission path as receive data; receive-data buffer means for storing the receive data received by the sending/receiving means; ID-generating means for generating an expected ID corresponding to each piece of unit data in the receive data; ECC-calculating means for calculating an expected ECC for the data sequence having each piece of unit data and the expected ID in the receive data; compare means for comparing the ECC and the expected ECC in the receive data; blocking buffer means for storing the corresponding unit data in the case where the ECC and the expected ECC in the receive data are the same; resend-request means for issuing a resend request including the expected ID to the sending unit in the case where the ECC and the expected ECC in the receive data are not the same; and blocking means for blocking all the unit data to reconstruct the parent data when all the unit data constituting the parent data is stored in the blocking buffer.

According to an eighth aspect of the present invention, there is provided a computer program for driving a computer to execute steps in a transmission data loss detection system, the steps including: steps to be executed on a sending computer, including deblocking parent data into each piece of unit data, storing each piece of deblocked unit data by the deblocking means, generating an ID for each piece of unit data, generating an ECC for the data sequence having the unit data and the ID, storing the data sequence having the unit data and the ECC, and sending the data sequence stored in the send-data buffer means to a transmission path as send data; and steps to be executed on a receiving computer, including receiving the send data from a transmission path as receive data, storing the receive data received by the sending/receiving means, generating an expected ID corresponding to each piece of unit data in the receive data, calculating an expected ECC for the data sequence having each piece of unit data and the expected ID in the receive data, comparing the ECC and the expected ECC in the receive data, storing the unit data in the case where the ECC and the expected ECC in the receive data are the same, issuing a resend request including the expected ID to the sending unit in the case where the ECC and the expected ECC in the receive data are not the same, and blocking all the unit data to reconstruct the parent data when all the unit data constituting the parent data is stored in blocking buffer means.

According to a ninth aspect of the present invention, there is provided a computer program for driving a sending computer to execute steps in a transmission data loss detection system, the steps including: deblocking parent data into each piece of unit data; storing each deblocked unit data; generating an ID corresponding to each piece of unit data; generating an ECC for the data sequence having the unit data and the ID; send-data buffer means for storing the data sequence having the unit data and the ECC; and sending the data sequence stored in the send-data buffer means to a transmission path as send data.

According to a tenth aspect of the present invention, there is provided a computer program for driving a receiving computer to execute steps in a transmission data loss detection system, the steps including: receiving send data from a transmission path as receive data; storing the receive data received by the sending/receiving means; generating an expected ID for each piece of unit data in the receive data; calculating an expected ECC for the data sequence having each piece of unit data and the expected ID in the receive data; comparing the ECC and the expected ECC in the receive data; storing the corresponding unit data in the case where the ECC and the expected ECC in the receive data are the same; issuing a resend request including the expected ID to the sending unit in the case where the ECC and the expected ECC in the receive data are not the same; and blocking all the unit data to reconstruct the parent data when all the unit data constituting the parent data is stored in blocking buffer means.

The present invention provides a mechanism in which the sending unit deblocks parent data into pieces of unit data, and without adding redundant bits indicating the ID of the unit data, the receiving unit can detect a bit error or loss of the received unit data. With this arrangement, a bit error or loss of unit data can be detected without decreasing the usage efficiency of the bandwidth of the transmission path.

DESCRIPTION OF THE PREFERRED EMBODIMENTS

In the following, some embodiments of the present invention will be described with reference to the drawings.

Figure 1:
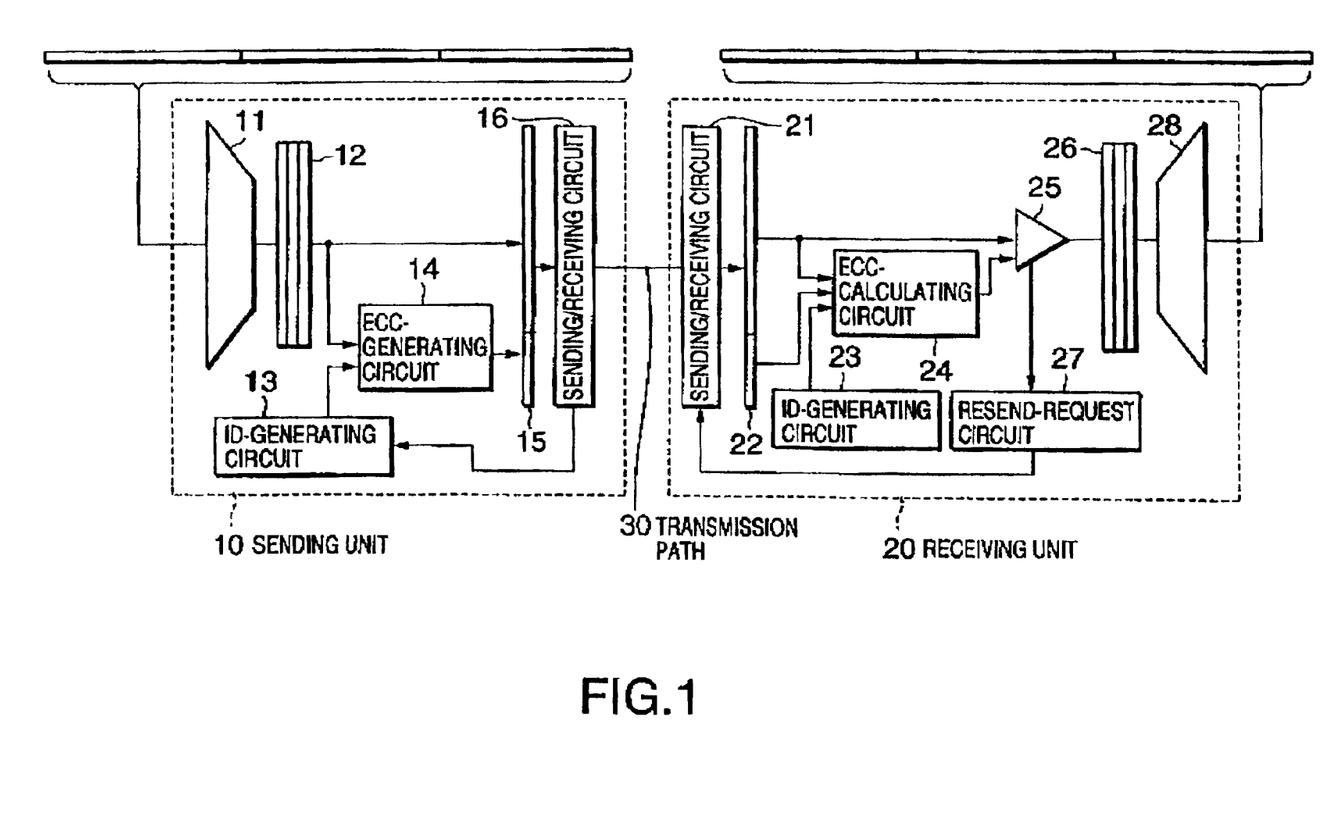
FIG. 1 is a block diagram illustrating the configuration of a transmission data loss detection system according to a first embodiment of the present invention.

FIG. 1 is a block diagram illustrating the configuration of a transmission data loss detection system according to a first embodiment of the present invention. The transmission data loss detection system according to the present embodiment includes, as main parts, a sending unit 10, a receiving unit 20, and a transmission path 30 connecting the sending unit 10 and the receiving unit 20.

The sending unit 10 includes a deblocking circuit 11 for deblocking parent data into pieces of unit data, a deblocking buffer 12 for storing the unit data which is deblocked by the deblocking circuit 11, an ID-generating circuit 13 for generating an ID for each piece of unit data, for example, cyclically in the range of integers from 1 to 4, an ECC-generating circuit 14 for generating an ECC for a data sequence containing the unit data and the ID, a send-data buffer 15 for storing the data sequence containing the unit data and the ECC, and a sending/receiving circuit 16 for sending the data stored in the send-data buffer 15, as send data, to the transmission path 30.

The receiving unit 20 includes a sending/receiving circuit 21 for receiving the send data from the transmission path 30, a receive-data buffer 22 for storing the receive data which is received by the sending/receiving circuit 21, an ID-generating circuit 23 for generating an expected ID for the unit data in the receive data, for example, in the range of integers from 1 to 4, an ECC-calculating circuit 24 for calculating an expected ECC for the data sequence having the unit data and the expected ID, a compare circuit 25 for comparing the ECC in the receive data and the expected ECC, a blocking buffer 26 for storing the unit data when the ECC in the receive data and the expected ECC are the same, a resend-request circuit 27 for issuing a resend request containing the expected ID to the sending unit 10, and a blocking circuit 28 for blocking the unit data which is stored in the blocking buffer 26 and reconstructing the unit data to produce the parent data.

The transmission path 30 is singular, whether the connection is serial or parallel. This means that the transmission path 30 is used for one-to-one data transmission between the sending unit 10 and the receiving unit 20. For example, the transmission path 30 corresponds to a bus between bus bridges and a connecting cable between computers.

Figure 2:
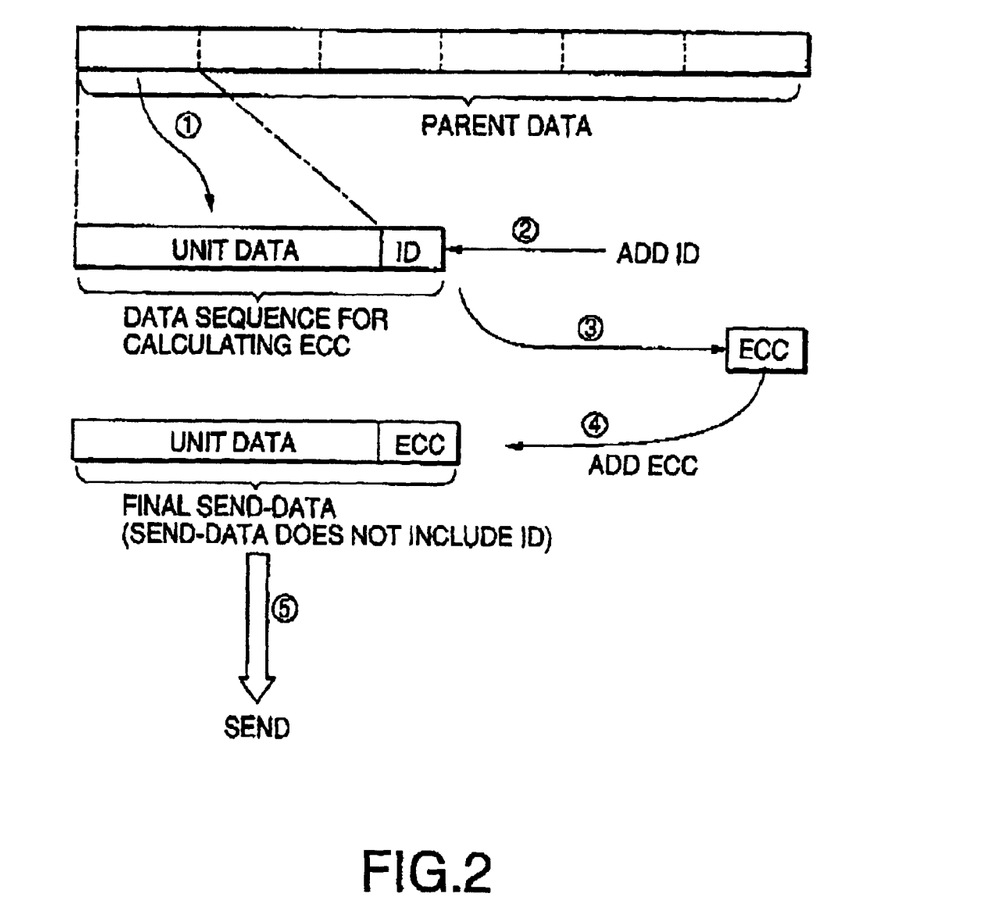
FIG. 2 illustrates data transition in a sending unit in FIG. 1.

FIG. 2 illustrates data transition in the sending unit 10. Parent data (corresponding to a frame including a header, data body and so on) is a variable-length data sequence, and a fixed-length header contains information such as the data length of the data body and so on.

Figure 3:
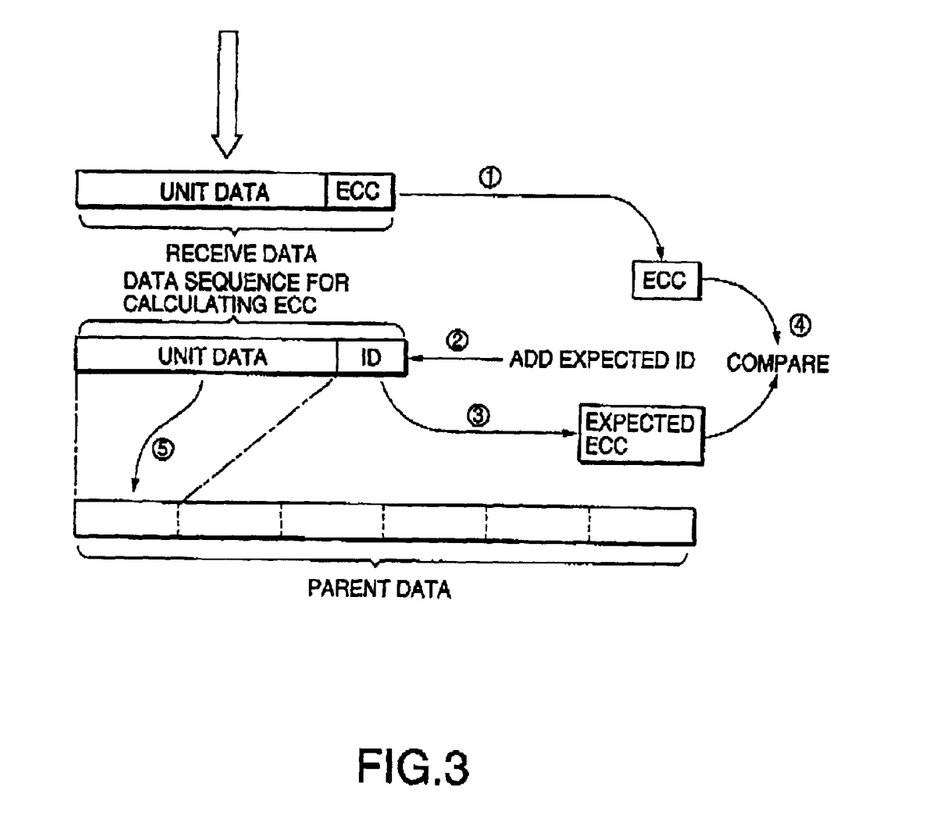
FIG. 3 illustrates data transition in a receiving unit in FIG. 1.

FIG. 3 illustrates data transition in the receiving unit 20.

Figure 4:
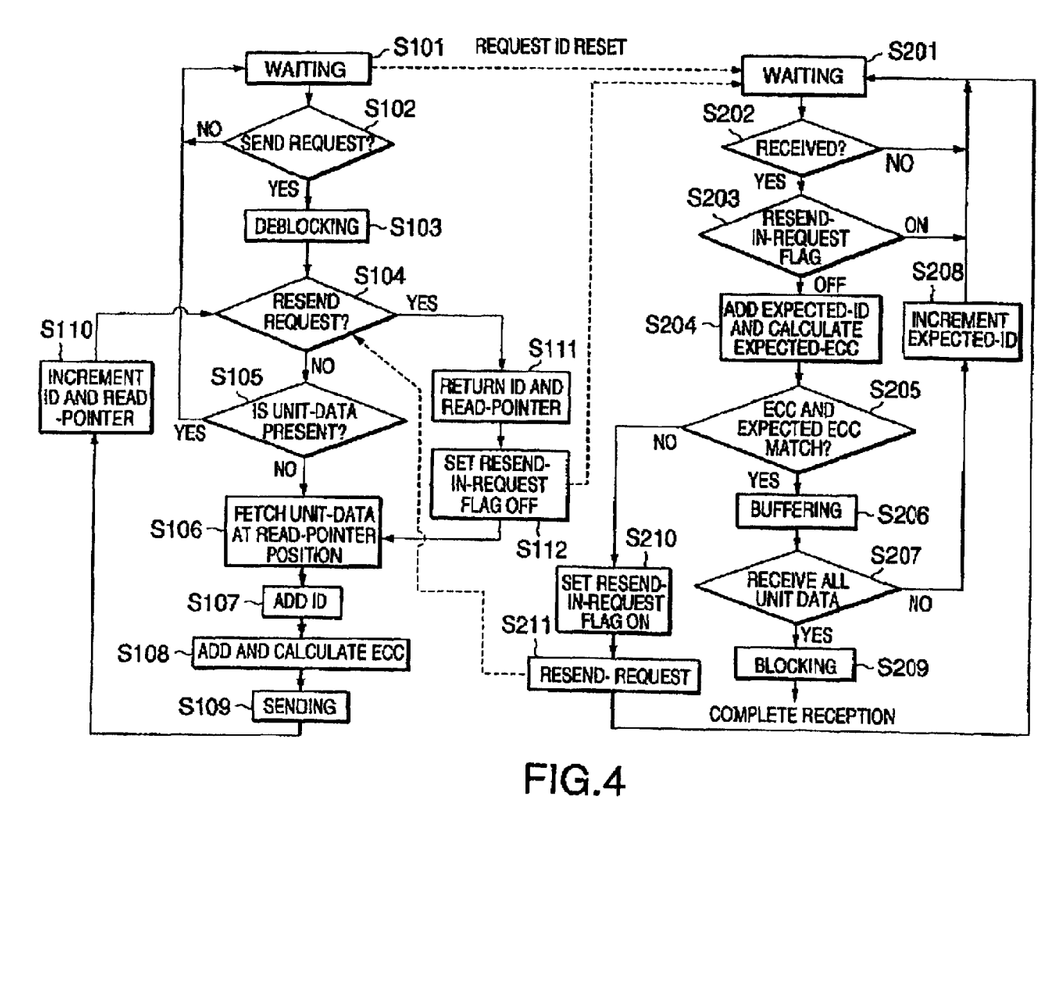
FIG. 4 is a flowchart illustrating the processing of the sending unit and the receiving unit.

As shown in FIG. 4, the processing of the sending unit 10 includes a waiting step S101, a send-request determination step S102, a deblocking step S103, a resend-request determination step S104, a unit-data's presence determination step S105, a fetch unit-data at the read-pointer position step S106, an ID-adding step S107, a ECC-calculating and adding step S108, a sending step S109, an ID and read-pointer increment step S110, an ID and read-pointer return step S111, and a set resend-in-request flag OFF step S112.

As shown in FIG. 4, the processing of the receiving unit 20 includes a waiting step S201, a receipt determination step S202, a resend-in-request flag determination step S203, an expected-ID adding and expected-ECC calculating step S204, a compare ECC and expected-ECC step S205, a buffering step S206, a receipt of all unit-data determination step S207, an expected-ID increment step S208, a blocking step S209, a set resend-in-request flag ON step S210, and a resend-request step S211.

Figure 5:
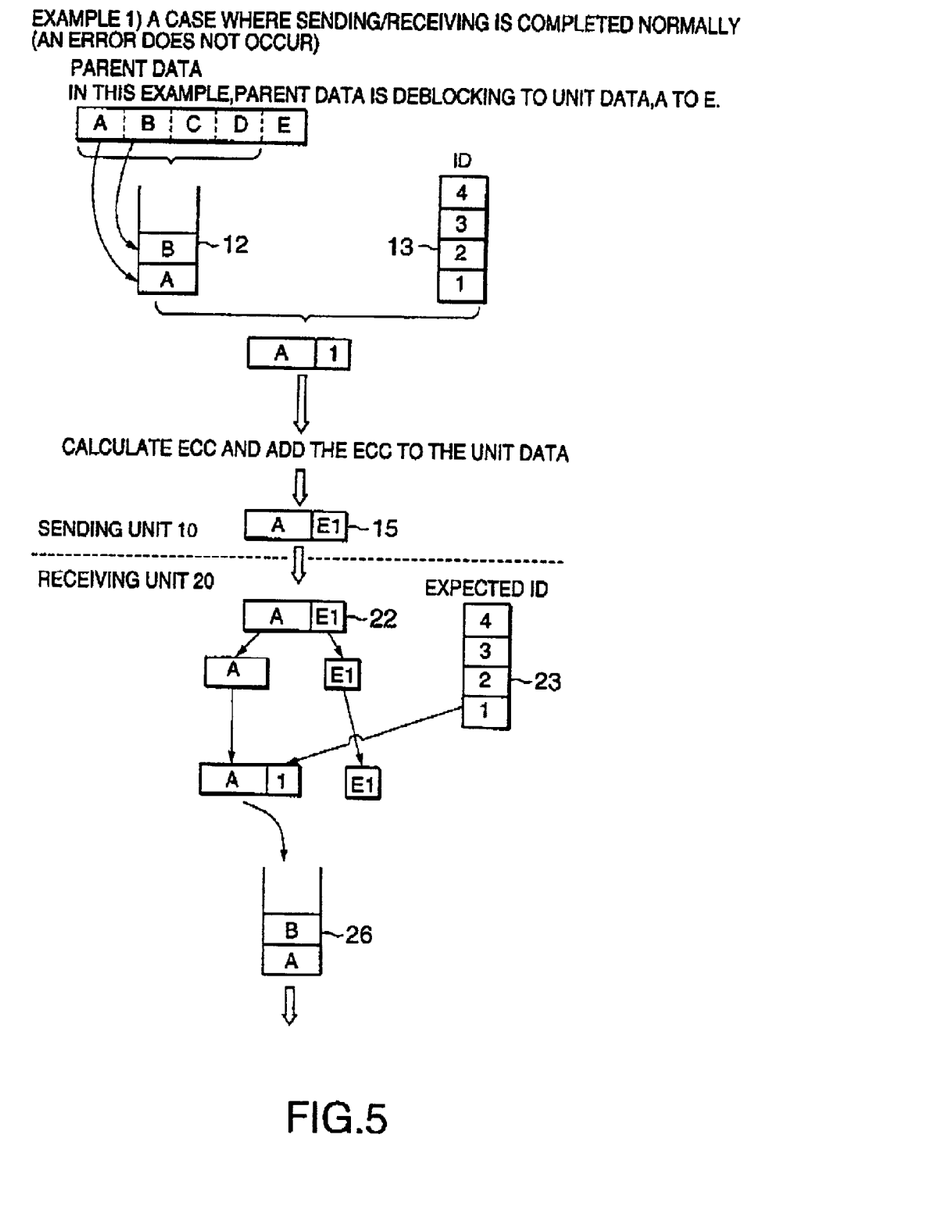
FIG. 5 illustrates a case where sending/receiving data is completed normally (an error has not occurred)

FIG. 5 illustrates a case where sending/receiving data is completed normally (an error has not occurred).

Figure 6:
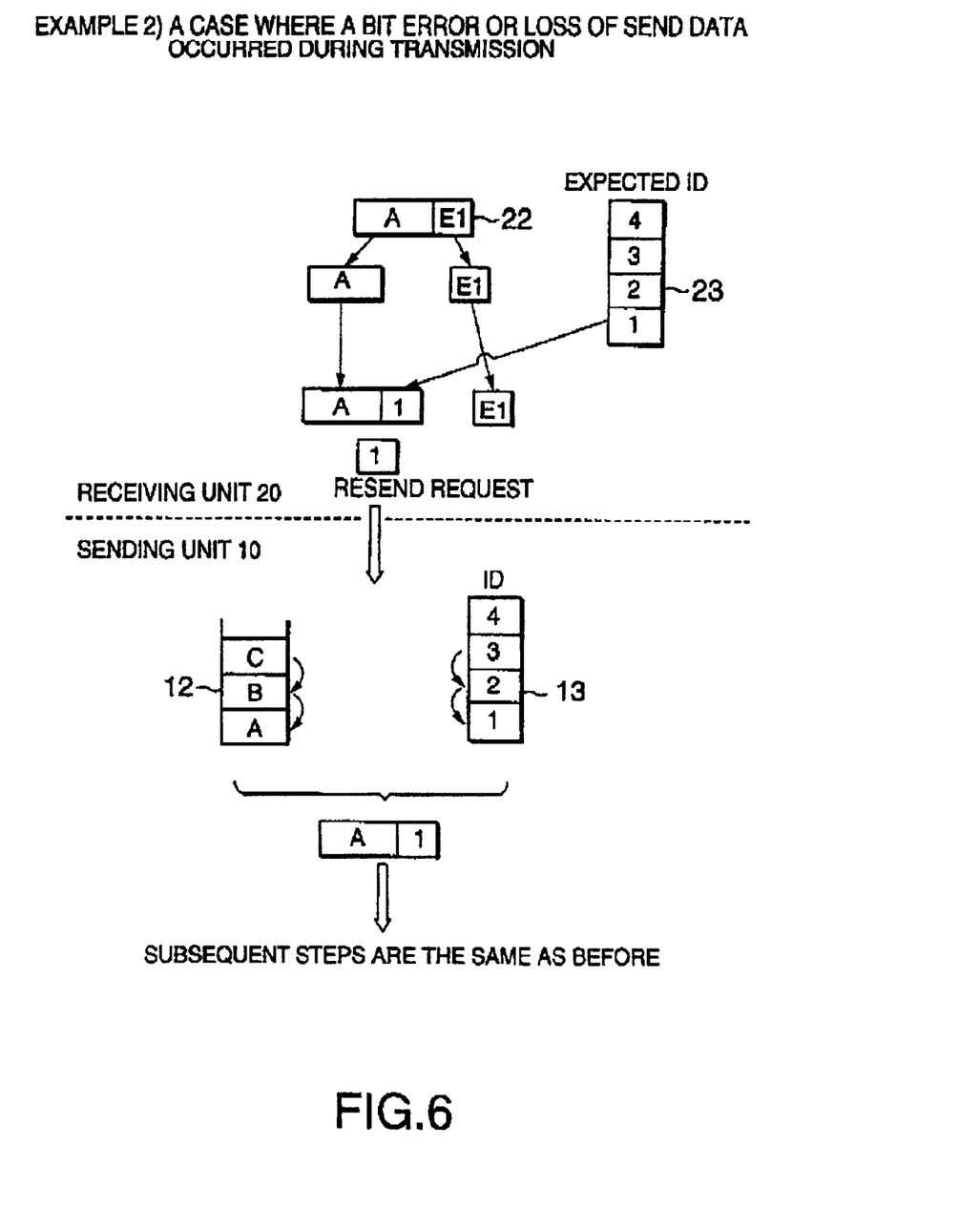
FIG. 6 illustrates a case where a bit error or loss has occurred during transmission.

FIG. 6 illustrates a case where a bit error or loss has occurred (a bit error or loss of send data has occurred) during transmission.

Next the operations of the transmission data loss detection system according to the first embodiment arranged in this manner will be described with reference to FIGS. 1 to 6.

In the sending unit 10, when a send request of parent data is made ("Yes" in step S102) in a waiting state (step S101), the deblocking circuit 11 deblocks the parent data into fixed-length unit data (refer to FIG. 2(1)), and stores a plurality of deblocked unit data in a deblocking buffer 12 sequentially (step S103).

Next, the sending unit 10 determines whether or not the send request is a resend request (step S104). If the send request is not a resend request, a determination is performed of whether or not unit data exists at the position indicated by the read pointer (the initial value is 1) in the deblocking buffer 12 (step S105). The details will be determined based on the data length in the header and the fixed length of the unit data.

When unit data does not exist at the position indicated by the read pointer in the deblocking buffer 12, there is not a sending target. Thus the sending unit 10 returns the control to step S101 to be in the waiting state, resets the ID, and issues an ID-reset request to the receiving unit 20. When the ID-reset request is made, the receiving unit 20 resets the expected ID to the initial value 1.

When unit data exists at the position indicated by the read pointer in the deblocking buffer 12, the sending unit 10 fetches the unit data at the position (step S106). Then an ID generated by the ID-generating circuit 13 is added to the fetched unit data (refer to FIG. 2(2)) (Step S107).

Next, the sending unit 10 calculates an ECC for the data sequence having the unit data and the ID by the ECC-generating circuit 14 (refer to FIG. 2(3)). Then the ECC is added to the unit data and stored in the send-data buffer 15 (refer to FIG. 2(4))(step S108).

For example, when the unit data length is 64 bits, if a Reed-Solomon product code, a binary BCH code, a Viterbi convolutional code, or other code is used for an ECC, the data length of the ECC becomes 8 bits. In the same manner, when the unit data length is 64 bits, if a cyclic redundancy check code (CRC code) is used for an ECC, the data length of the ECC becomes 16 bits or 32 bits.

Subsequently, the sending unit 10 specifies the data sequence having the unit data and the ECC stored in the send-data buffer 15 as send data, and sends the send data to the transmission path 30 by the sending/receiving circuit 16 (refer to FIG. 2(5)) (step S109).

Then the sending unit 10 increments the ID cyclically and also increments the read pointer (step S110), returns the control to step S104, and repeats the processing from step S104 to step S110 until unit data does not exist at the position indicated by the read pointer in the deblocking buffer 12.

At the same time, when the receiving unit 20 receives the send data as receive data by the sending/receiving circuit 21 from the transmission path 30 ("Yes" in step S202) in the waiting state (step S201), a determination is performed of whether the resend-in-request flag is ON or OFF (step S203). If the resend-in-request flag is ON, the receive data is discarded and the control is returned to step S201, and the processing goes to the waiting state again.

If the resend-in-request flag is OFF, the receiving unit 20 separates the receive data into the unit data and the ECC (refer to FIG. 3(1)). Then an expected ID generated by the ID-generating circuit 23 is added to the unit data (refer to FIG. 3(2)), and an expected ECC is calculated for the data sequence having the unit data and the expected ID by the ECC-calculating circuit 24 (refer to FIG. 3(3)) (step S204).

Next, the receiving unit 20 compares the ECC in the receive data and the calculated expected ECC by the compare circuit 25 (refer to FIG. 3(4))(step S205). If both values are the same, buffering (storing in sequence from the top) is performed of the unit data in the receive data into the blocking buffer 26 for blocking (refer to FIG. 3(5))(step S206).

Subsequently, the receiving unit 20 determines whether or not all the unit data to constitute the parent data has been received from the sending unit 10 based on the data length in the header and so on (step S207). If all the unit data has not been received, the expected ID is incremented cyclically (step S208), the control is returned to step S201, and the processing goes to the waiting state.

If the ECC in the receive data and the calculated expected ECC are not the same in step S205, the ID in the receive data and the expected ID are different, thus determination in made that a bit error or loss of the unit data has occurred along the transmission path 30. Thus the resend-in-request flag is set ON (step S210), and then, a resend request including the expected ID is issued to the sending unit 10, the control is returned to step S201 and the processing goes to the waiting state.

When the sending unit 10 receives the resend request ("Yes" in step S104), the ID is returned to the expected ID contained in the resend request, the read pointer is returned by the value corresponding to the difference between the ID and the expected ID (step S111), and a "set resend-in-request flag OFF" request is sent to the receiving unit 20. After this (step S112), the sending unit 10 moves the control to step S106, and repeats sending data from the unit data at the position indicated by the read pointer in the blocking buffer 12 (from step S104 to step S110).

When receiving the "set resend-in-request flag OFF" request, the receiving unit 20 sets the flag OFF.

After this, as the receive data, receiving is performed of the send data having the unit data added with the ECC on the basis of the ID which is identical with the expected ID. If the resend-in-request flag is OFF ("Yes" in step S202, "OFF" in step S203), the receiving unit 20 separates the receive data into the unit data and the ECC (refer to FIG. 3(1)), adds the expected ID to the unit data (refer to FIG. 3(2)), and calculates the expected ECC for the data sequence having the unit data and the ID by the ECC-calculating circuit 24 (refer to FIG. 3(3)) (step S204).

The receiving unit 20 compares the ECC in the receive data and the expected ECC (refer to FIG. 3(4)) (step S205). The ECC and the expected ECC are the same unless a bit error or loss of the send data which was resent occurs. In this case, the processing is repeated from steps S206 to S208 and S201 to S205.

When receiving of all the unit data is complete ("Yes" in step S207), the receiving unit 20 blocks the unit data stored in the blocking buffer 26 by the blocking circuit 28 (step S209). Thus the receiving of the first parent data is complete. In this regard, the receiving unit 20 returns the control to step S201 after this, and the processing goes to the waiting state in order to receive the next parent data.

Here, description is given of the case in which sending/receiving is completed normally (an error does not occur) with reference to the example shown in FIG. 5.

Given that the parent data is deblocked into five pieces of unit data A to E, and then stored in the deblocking buffer 12.

First, the sending unit 10 calculates ECC=E1 for the data sequence which is given by adding ID=1 to the unit data A. Then the data sequence having the unit data A and ECC=E1 is sent to the transmission path 30 as send data.

The receiving unit 20 calculates the expected ECC for the data sequence which is given by adding the expected ID=1 to the unit data A in the receive data. If the ECC in the receive data and the expected ECC are the same, the correct unit data is received, and the unit data A is stored in the blocking buffer 26.

Such processing is repeated for each piece of unit data A to E, and receiving the parent data is complete in the receiving unit 20.

Next, description will be specifically given of the case where a bit error or loss of the send data occurred during the transmission with reference to FIG. 6.

The receiving unit 20 calculates the expected ECC for the data sequence which is given by adding the "expected ID 1" to the unit data A in the receive data. If the "ECC=E1" in the receive data and the expected ECC are not the same, a bit error or loss of the send data has occurred. Thus the resend request including "expected ID=1" is issued to the sending unit 10.

When the sending unit 10 receives the resend request including "expected ID=1", the ID at that timing (given that this equals 3) is returned to "expected ID=1", and the read pointer indicating the deblocking buffer 12 is returned by ("ID"–"expected ID"=2), and the ECC is added to the unit data A to give the send data for resending.

In such a manner, according to the first embodiment, the sending unit 10 can inform the receiving unit 20 of the unit data's ID without adding any redundant bits for ID to the unit data. With this arrangement, detection of a bit error or loss of the send data can be possible without decreasing the usage efficiency of the bandwidth of the transmission path 30.

Also, the sanding unit 10 can send unit data continuously, and the receiving unit 20 can correctly receive the parent data which is sent by the sending unit 10 even through the transmission path 30 on which loss of unit data might occur in addition to a bit error of unit data.

Figure 7:
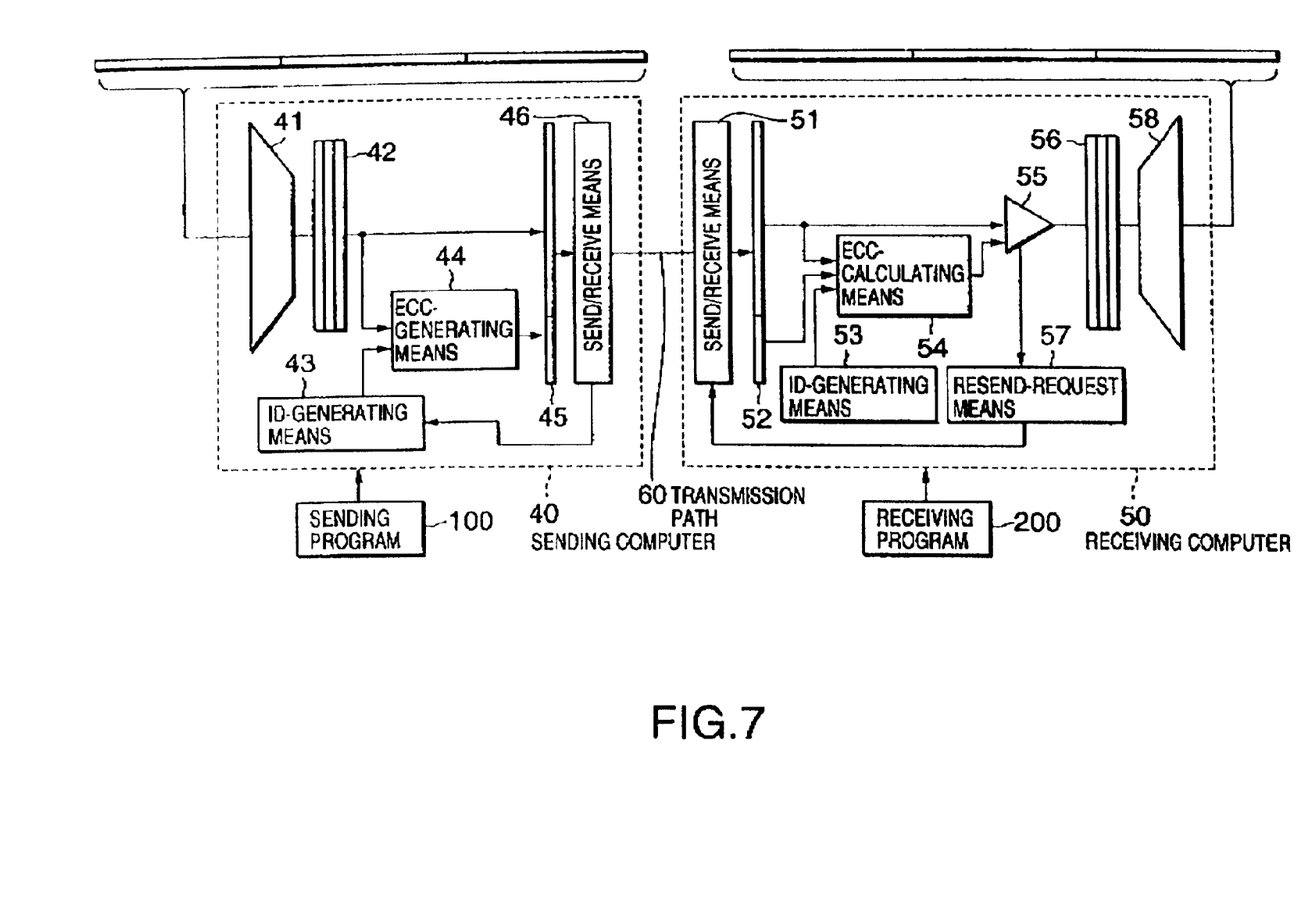
FIG. 7 is a block diagram illustrating the configuration of a transmission data loss detection system according to a second embodiment of the present invention.

Next, a second embodiment of the present invention will be described with reference to FIG. 7. FIG. 7 is a block diagram illustrating the configuration of a transmission data loss detection system according to a second Embodiment of the present invention. The transmission data loss detection system according to the present embodiment includes, as main parts, a sending computer 40, a receiving computer 50, a transmission path 60 connecting the sending computer 40 and the receiving computer 50, sending program 100 for performing sending processing on the sending computer 40, and receiving program 200 for performing receiving processing on the receiving computer 50.

The sending computer 40 includes deblocking means 41 for deblocking parent data into unit data, deblocking buffer means 42 for storing the unit data which is deblocked by the deblocking means 41, ID-generating means 43 for generating an ID for each piece of unit data, ECC-generating means 44 for generating an ECC for a data sequence containing the unit data and the ID, send-data buffer means 45 for storing the data sequence containing the unit data and the ECC, and sending/receiving means 46 for sending the data stored in the send-data buffer means 45, as send data, to the transmission path 60.

The receiving computer 50 includes sending/receiving means 51 for receiving the send data as receive data from the transmission path 60, receive-data buffer means 52 for storing the receive data, ID-generating means 53 for generating an expected ID for the unit data in the receive data, ECC-calculating means 54 for calculating an expected ECC for the data sequence having the unit data and the expected ID, compare means 55 for comparing the ECC in the receive data and the expected ECC, blocking buffer means 56 for storing the unit data when the ECC in the receive data and the expected ECC are the same, resend-request means 57 for issuing a resend request containing the expected ID to the sending computer 40, and blocking means 58 for blocking the unit data which is stored in the blocking buffer means 56 and reconstructing the data to produce the parent data.

With such a configuration, in the transmission data loss detection system according to the second embodiment, when the sending program 100 is read onto the sending computer 40 and executed, deblocking means 41, deblocking buffer means 42, ID-generating means 43, ECC-generating means 44, send-data buffer means 45, and sending/receiving means 46 perform each function, respectively.

In this regard, the detailed operation of each means 41 to 46 is the same as the operation of each circuit element 11 to 16 in the transmission data loss detection system according to the first embodiment shown in FIG. 1. Thus the detailed description thereof is omitted.

Also, when the receiving program 200 is read onto the sending computer 50 and executed, sending/receiving means 51, receive-data buffer means 52, ID-generating means 53, ECC-calculating means 54, compare means 55, blocking buffer means 56, resend-request means 57, and blocking means 58 perform each function, respectively.

In this regard, the detailed operation of each means 51 to 58 is the same as the operation of each circuit element 21 to 28 in the transmission data loss detection system according to the first embodiment shown in FIG. 1. Thus the detailed description thereof is omitted.

In the case where the facilities of the system is realized by software as the transmission data loss detection system according to the second embodiment, the same functions and effects can be obtained as in the case where the facilities of the system is realized by hardware as the transmission data loss detection system according to the first embodiment.

According to the present invention, in a data transmission system in which parent data is deblocked into unit data for transmission, the receiving unit can be informed of the ID of the unit data without adding any redundant bits for the ID of the unit data. The reason for this is that an ECC is created for the data sequence having unit data and an added ID, and the send data is created by the data sequence having the unit data and an added ECC. With this arrangement, a bit error or loss of unit data can be detected without decreasing the usage efficiency of the bandwidth.

Also according to the present invention, the sending unit can send unit data continuously, and the receiving unit can correctly receive the parent data which is sent by the sending unit even through the transmission path on which loss of unit data might occur in addition to a bit error of unit data. The reason for this is that when the ID of the unit data sent from the sending unit and the expected ID of the receiving unit are not the same, the receiving unit issues a resend request including the expected ID.

What is claimed is:

1. A transmission data loss detection method in a data transmission system in which a sending unit deblocks parent data into pieces of unit data and sends each piece of unit data in sequence, and a receiving unit blocks each piece of received unit data to reconstruct the parent data, comprising the steps of;

calculating an ECC for a data sequence having an ID added corresponding to each piece of unit data in the sending unit;

sending send data having each piece of unit data with the added ECC;

returning each ID to the corresponding expected ID and resending from the unit data corresponding to the expected ID in case of receiving a resend request including an expected ID from the receiving unit;

receiving the send data as receive data and calculating the expected ECC for the data sequence having an expected ID added corresponding to each piece of unit data in the receive data in the receiving unit;

comparing the ECC in the receive data and the expected ECC;

issuing the resend request including the expected ID to the sending unit in the case where the ECC in the receive data and the expected ECC are not the same; and blocking the corresponding unit data in the case where the ECC in the receive data and the expected ECC are the same.

2. A transmission data loss detection method as claimed in claim 1, wherein the ID is incremented cyclically in a predetermined range.

3. A transmission data loss detection system, comprising:

a sending unit for deblocking parent data into each piece of unit data and sending each piece of unit data in sequence; and a receiving unit for blocking each piece of received unit data to reconstruct the parent data,
wherein the sending unit includes
a deblocking circuit for deblocking parent data into each piece of unit data,
a deblocking buffer for storing each piece of unit data deblocked by the deblocking circuit,
an ID-generating circuit for generating an ID corresponding to each piece of unit data,
an ECC-generating circuit for generating an ECC for the data sequence having the unit data and the ID,
a send-data buffer for storing the data sequence having the unit data and the ECG, and
a sending/receiving circuit for sending the data sequence stored in the send-data buffer to a transmission path as send data; and
the receiving unit includes
a sending/receiving circuit for receiving the send data from the transmission path as receive data,
a receive-data buffer for storing the receive data received by the sending/receiving circuit,
an ID-generating circuit for generating an expected ID corresponding to each piece of unit data in the receive data,
an ECC-calculating circuit for calculating an expected ECC for the data sequence having the unit data and the expected ID in the receive data,
a compare circuit for comparing the ECC and the expected ECC in the receive data,
a blocking buffer for storing the corresponding unit data in the case where the ECC and the expected FCC in the receive data are the same,
a resend-request circuit for issuing a resend request including the expected ID to the sending unit in the case where the ECC and the expected ECC in the receive data are not the same, and
a blocking circuit for blocking all the unit data to reconstruct the parent data when all the unit data constituting the parent data is stored in the blocking buffer.

4. A sending unit comprising:
a deblocking circuit for deblocking parent data into each piece of unit data;
a deblocking buffer for storing each piece of unit data deblocked by the deblocking circuit;
an ID-generating circuit for generating an ID corresponding to each piece of unit data;
an ECC-generating circuit for generating an ECG for the data sequence having the unit data and the corresponding ID;
a send-data buffer for storing the data sequence having the unit data and the ECC; and
a sending/receiving circuit for sending the data sequence stored in the send-data buffer to a transmission path as send data.

5. A receiving unit comprising:
a sending/receiving circuit for receiving send data from a transmission path as receive data;
a receive-data buffer for storing the receive data received by the sending/receiving circuit;
an ID-generating circuit for generating an expected ID corresponding to each piece of unit data in the receive data;
an ECC-calculating circuit for calculating an expected ECC for the data sequence having each piece of unit data and the expected ID in the receive data;
a compare circuit for comparing the ECC and the expected ECC in the receive data;
a blocking buffer for storing the corresponding unit data in the case where the ECC and the expected ECC in the receive data are the same;
a resend-request circuit for issuing a resend request including the expected ID to the sending unit in the case where the ECC and the expected ECC in the receive data are not the same; and
a blocking circuit for blocking all the unit data to reconstruct the parent data when all the unit data constituting the parent data is stored in the blocking buffer.

6. A transmission data loss detection system, comprising:
a sending unit for deblocking parent data into each piece of unit data and sending each piece of unit data in sequence; and
a receiving unit for blocking each piece of received unit data to reconstruct the parent data,
wherein the sending unit includes
a deblocking means for deblocking parent data into each piece of unit data,
a deblocking buffer means for storing each piece of unit data deblocked by the deblocking means,
an ID-generating means for generating an ID corresponding to each piece of unit data,
an ECC-generating means for generating an ECC for the data sequence having the unit data and the ID,
a send-data buffer means for storing the data sequence having the unit data and the ECC, and
a sending/receiving means for sending the data sequence stored in the send-data buffer to a transmission path as send data; and
the receiving unit includes
a sending/receiving means for receiving the send data from the transmission path as receive data,
a receive-data buffer means for storing the receive data received by the sending/receiving means,
an ID-generating means for generating an expected ID corresponding to each piece of unit data in the receive data,
an ECC-calculating means for calculating an expected ECC for the data sequence having the unit data and the expected ID in the receive data,
a compare means for comparing the ECC and the expected ECC in the receive data,
a blocking buffer means for storing the corresponding unit data in the case where the ECC and the expected ECC in the receive data are the same,
a resend-request means for issuing a resend request including the expected ID to the sending unit in the case where the ECC and the expected ECC in the receive data are not the same, and
a blocking means for blocking all the unit data to reconstruct the parent data when all the unit data constituting the parent data is stored in the blocking buffer.

7. A sending unit comprising:
deblocking means for deblocking parent data into each piece of unit data;
deblocking buffer means for storing each piece of unit data deblocked by the deblocking means;
ID-generating means for generating an ID corresponding to each piece of unit data;
ECC-generating means for generating an ECC for the data sequence having the unit data and ID;

send-data buffer means for storing the data sequence having the unit data and the ECC; and sending/receiving means for sending the data sequence stored in the send-data buffer to a transmission path as send data.

8. A receiving unit comprising:

sending/receiving means for receiving the send data from a transmission path as receive data;

receive-data buffer means for storing the receive data received by the sending/receiving means;

ID-generating means for generating an expected ID corresponding to each piece of unit data in the receive data;

ECC-calculating means for calculating an expected ECC for the data sequence having each piece of unit data and the expected ID in the receive data;

compare means for comparing the ECC and the expected ECC in the receive data;

blocking buffer means for storing the corresponding unit data in the case where the ECC and the expected ECC in the receive data are the same;

resend-request means for issuing a resend request including the expected ID to the sending unit in the case where the ECC and the expected ECC in the receive data are not the same; and blocking means for blocking all the unit data to reconstruct the parent data when all the unit data constituting the parent data is stored in the blocking buffer.

9. A computer program for driving a computer to execute steps in a transmission data loss detection system, the steps comprising:

steps to be executed on a sending computer, including deblocking parent data into each piece of unit data, storing each piece of deblocked unit data by the deblocking means, generating an ID for each piece of unit data, generating an ECC for the data sequence having the unit data and the ID, storing the data sequence having the unit data and the ECC, and sending the data sequence stored in the send-data buffer means to a transmission path as send data; and steps to be executed on a receiving computer, including receiving the send data from a transmission path as receive data, storing the receive data received by the sending/receiving means, generating an expected ID corresponding to each piece of unit data in the receive data, calculating an expected ECC for the data sequence having each piece of unit data and the expected ID in the receive data, comparing the ECC and the expected ECC in the receive data, storing the unit data in the case where the ECC and the expected ECC in the receive data are the same, issuing a resend request including the expected ID to the sending unit in the case where the ECC and the expected ECC in the receive data are not the same, and blocking all the unit data to reconstruct the parent data when all the unit data constituting the parent data is stored in blocking buffer means.

10. A computer program for driving a sending computer to execute steps in a transmission data loss detection system, the steps comprising:

deblocking parent data into each piece of unit data;

storing each deblocked unit data;

generating an ID corresponding to each piece of unit data;

generating an ECC for the data sequence having the unit data and the ID;

send-data buffer means for storing the data sequence having the unit data and the ECC; and sending the data sequence stored in the send-data buffer means to a transmission path as send data.

11. A computer program for driving a receiving computer to execute steps in a transmission data loss detection system, the steps comprising:

receiving send data from a transmission path as receive data;

storing the receive data received by the sending/receiving means;

generating an expected ID for each piece of unit data in the receive data;

calculating an expected ECC for the data sequence having each piece of unit data and the expected ID in the receive data;

comparing the ECC and the expected ECC in the receive data;

storing the corresponding unit data in the case where the ECC and the expected ECC in the receive data are the same;

issuing a resend request including the expected ID to the sending unit in the case where the ECC and the expected ECG in the receive data are not the same; and blocking all the unit data to reconstruct the parent data when all the unit data constituting the parent data is stored in blocking buffer means.

12. A transmission data loss detection method comprising:

combining identification (ID) data that identifies a respective unit of data with the respective unit of data to form a data sequence;

calculating a send error code (ECC) for the data sequence, wherein the send ECC is based on both the ID data and the respective unit of data;

generating send data that comprises only the respective unit of data and the calculated send ECC.

13. A transmission data loss detection method as claimed in claim 12, further comprising:

receiving the send data comprising the unit of data and the send ECC;

separating the unit of data from the send ECC;

adding expected ID data to the separated unit of data to form a receive data sequence;

calculating an expected ECC for the receive data sequence, wherein the expected ECC is based on both the expected ID data and the unit of data.

14. A transmission data loss detection method as claimed in claim 13, further comprising:

comparing the calculated expected ECC to the separated send ECC; and requesting that the send data be resent if the expected ECC and the separated send ECC are not the same.

* * * * *